(12) United States Patent
Satoh

(10) Patent No.: US 10,720,918 B2
(45) Date of Patent: Jul. 21, 2020

(54) SEMICONDUCTOR DEVICE

(71) Applicant: Mitsubishi Electric Corporation, Tokyo (JP)

(72) Inventor: Katsumi Satoh, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/559,391

(22) Filed: Sep. 3, 2019

(65) Prior Publication Data

US 2020/0112307 A1 Apr. 9, 2020

(30) Foreign Application Priority Data

Oct. 9, 2018 (JP) ................. 2018-190723

(51) Int. Cl.
| | | |
|---|---|---|
| H03K 17/56 | (2006.01) | |
| H03K 17/567 | (2006.01) | |
| H01L 29/739 | (2006.01) | |
| H03K 17/60 | (2006.01) | |
| H02M 7/5387 | (2007.01) | |
| H02M 7/162 | (2006.01) | |

(52) U.S. Cl.
CPC ....... *H03K 17/567* (2013.01); *H01L 29/7393* (2013.01); *H02M 7/1623* (2013.01); *H02M 7/53873* (2013.01); *H03K 17/602* (2013.01)

(58) Field of Classification Search
CPC .............. H03K 17/567; H03K 17/602; H02M 7/53873; H02M 7/1623; H01L 29/7393

USPC ........................................ 327/423
See application file for complete search history.

(56) References Cited

U.S. PATENT DOCUMENTS

| | | | |
|---|---|---|---|
| 2017/0026034 A1* | 1/2017 | Akiyama | .......... H03K 17/0406 |
| 2017/0201188 A1* | 7/2017 | Ushijima | ................ H01L 25/18 |
| 2018/0308757 A1* | 10/2018 | Kakimoto | ............... H01L 27/06 |

FOREIGN PATENT DOCUMENTS

| | | | |
|---|---|---|---|
| EP | 568353 A1 | * | 11/1993 |
| JP | 02155456 A | * | 6/1990 |
| JP | H02-155456 A | | 6/1990 |
| JP | 2002-100971 A | | 4/2002 |

* cited by examiner

*Primary Examiner* — Metasebia T Retebo
(74) *Attorney, Agent, or Firm* — Studebaker & Brackett PC

(57) ABSTRACT

Each of a P-side IGBT and an N-side IGBT connected in series to implement an arm includes a first gate and a second gate. In each of a drive circuit unit configured to control a voltage of the first gate with respect to a collector of the P-side IGBT, a drive circuit unit configured to control a voltage of the second gate with respect to an emitter of the P-side IGBT, and a drive circuit unit configured to control a voltage of the second gate with respect to a collector of the N-side IGBT, a signal processing circuit and an output circuit are electrically isolated from each other by an isolation structure.

17 Claims, 10 Drawing Sheets

SEMICONDUCTOR DEVICE

BACKGROUND OF THE INVENTION

Field of the Invention

The present invention relates to a semiconductor device.

Description of the Background Art

A structure of a semiconductor switching element including a plurality of control electrodes has been known. For example, Japanese Patent Laying-Open No. 2002-100971 describes an insulated gate bipolar transistor (IGBT) of a double-gate structure in which a main gate electrode and an auxiliary gate electrode are provided on an identical main surface. Japanese Patent Laying-Open No. 2002-100971 further describes a driving method of driving the double-gate IGBT while optimal turn-off characteristics are achieved.

SUMMARY OF THE INVENTION

What is called an arm configuration for selectively output a high voltage and a low voltage from a node of connection between two semiconductor switching elements by connecting the two semiconductor switching elements in series between a power line at the high voltage and a power line at the low voltage has been known as a representative use of a semiconductor switching element. For example, the arm configuration is employed in an inverter for DC/AC power conversion and a chopper circuit for DC/DC conversion.

In the arm configuration, an isolation structure is introduced into a drive circuit which controls a voltage of a control electrode of a semiconductor switching element. Introduction of the isolation structure complicates a structure and increases manufacturing cost, whereas it prevents a damaged portion from expanding when an abnormal condition occurs.

In an arm configuration implemented by a semiconductor switching element including a plurality of control electrodes, the number of control electrodes to be driven increases. Then, how an isolation structure is to be provided becomes an issue. In this connection, Japanese Patent Laying-Open No. 2002-100971 describes a method of driving a single double-gate IGBT, however, it fails to describe a configuration of a drive circuit in the arm configuration as described above.

An object of the present invention is to provide a configuration in which an isolation structure is appropriately provided in a drive circuit in an arm configuration to which a semiconductor switching element including a plurality of control electrodes is applied.

According to one aspect of the present invention, a semiconductor device which drives first and second semiconductor switching elements connected in series includes a first drive circuit configured to control on and off of the first semiconductor switching element and a second drive circuit configured to control on and off of the second semiconductor switching element. The first semiconductor switching element includes a first positive electrode and a first negative electrode as main electrodes and first and second control electrodes. The second semiconductor switching element includes a second positive electrode and a second negative electrode as main electrodes and third and fourth control electrodes. The first negative electrode and the second positive electrode are electrically connected to each other.

The first drive circuit includes first and second drive circuit units. The first drive circuit unit is configured to control a voltage of the first control electrode with respect to the first negative electrode. The second drive circuit unit is configured to control a voltage of the second control electrode with respect to the first positive electrode. The second drive circuit includes third and fourth drive circuit units. The third drive circuit unit is configured to control a voltage of the third control electrode with respect to the second negative electrode. The fourth drive circuit unit is configured to control a voltage of the fourth control electrode with respect to the second positive electrode. Each of the first to fourth drive circuit units includes a signal processing circuit and an output circuit. Each signal processing circuit is configured to output a pulse signal serving as a voltage command for a corresponding control electrode of the first to fourth control electrodes in response to an on and off command to turn on and off the first and second semiconductor switching elements. Each output circuit is configured to drive a voltage of the corresponding control electrode with respect to a corresponding main electrode of the first and second positive electrodes and the first and second negative electrodes, in response to the pulse signal from the signal processing circuit. Each of the first to third drive circuit units is configured to transmit the pulse signal from the signal processing circuit to the output circuit through an isolation structure.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
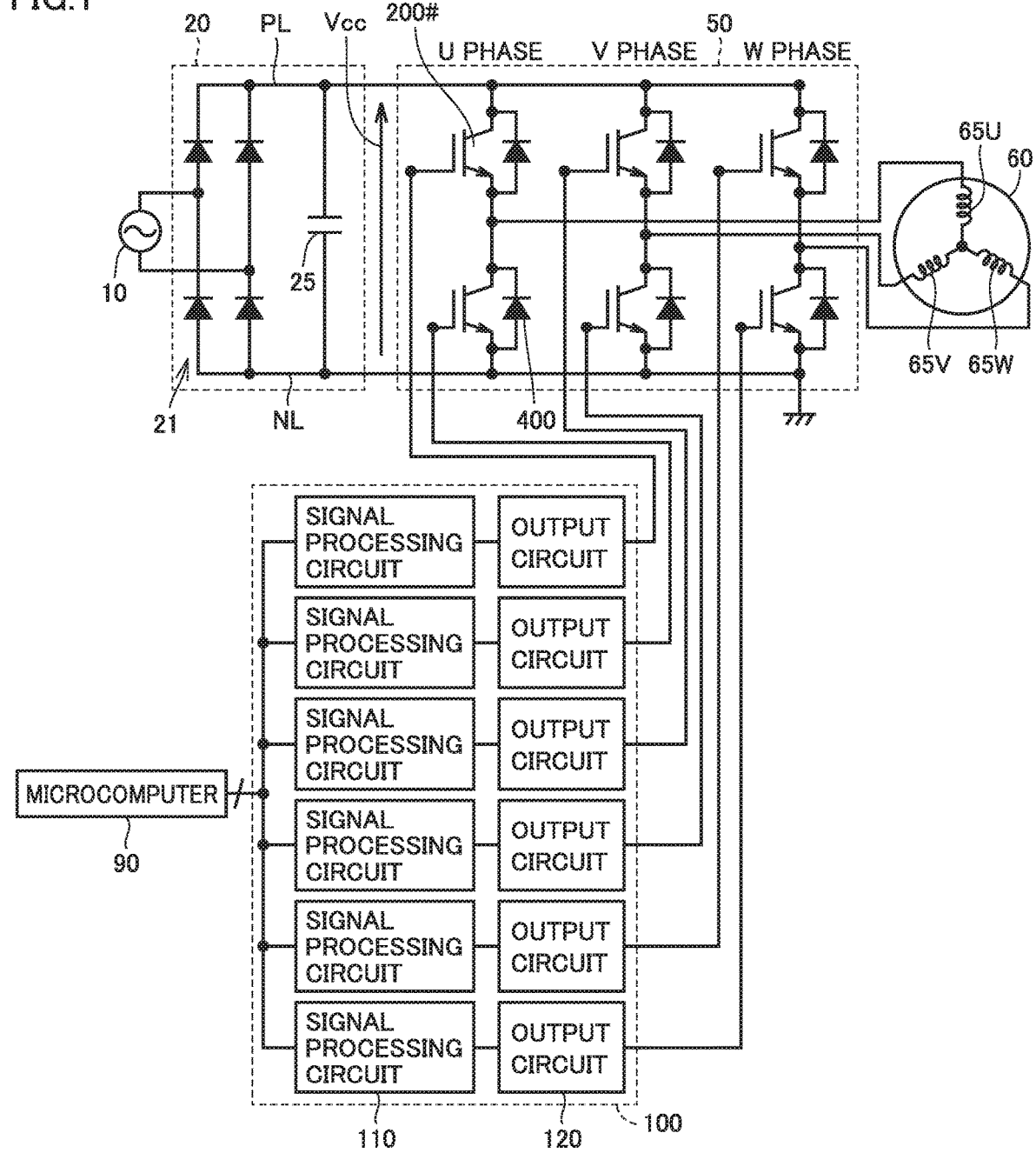
FIG. 1 is a circuit diagram illustrating one example of a power conversion system to which an arm configuration according to a comparative example is applied.

An embodiment of the present invention will be described in detail below with reference to the drawings. The same or corresponding elements in the drawings below have the same reference characters allotted and description thereof will not be repeated in principle.

First Embodiment

Description of Comparative Example

A configuration of a drive circuit in an arm configuration implemented by a semiconductor switching element including a single control electrode will initially be described as a comparative example of the present embodiment.

FIG. 1 is a circuit diagram illustrating one example of a power conversion system to which the arm configuration according to the comparative example is applied.

Referring to FIG. 1, the power conversion system includes an AC/DC converter 20 and a DC/AC inverter (which is also simply referred to as an "inverter" below) 50 and is configured to drive a motor 60 at a variable speed. In the example in FIG. 1, motor 60 is implemented by a three-phase alternating-current (AC) motor having three-phase coil windings 65U, 65V, and 65W applied to a stator (not shown).

AC/DC converter 20 includes a diode bridge 21 and a smoothing capacitor 25, and converts an AC voltage from an AC power supply 10 into a direct-current (DC) voltage (which is also referred to as a power supply voltage below) Vcc and outputs the DC voltage across a power line PL on a high voltage side and a power line NL on a low voltage side.

Inverter 50 includes six semiconductor switching elements (which are also simply denoted as an "IGBT" below because an IGBT is representatively employed) 200# and six diodes 400 which implement three-phase inverters which generate three-phase AC voltages of the U phase, the V phase, and the W phase. An arm is implemented by connection of two IGBTs 200# in series between power lines PL and NL in each of the U phase, the V phase, and the W phase.

On and off of each IGBT 200# in the comparative example is controlled by a single gate electrode. A voltage of a gate (control electrode) of each IGBT 200# is controlled by a drive circuit 100 in response to an on and off command from a microcomputer 90.

Drive circuit 100 includes a signal processing circuit 110 and an output circuit 120 in correspondence with each IGBT 200#. Signal processing circuit 110 generates a pulse signal subjected to timing processing in response to an on and off command from microcomputer 90. Output circuit 120 drives a gate voltage of corresponding IGBT 200# to one of a voltage for turning on IGBT 200# and a voltage for turning off IGBT 200# in response to a pulse signal from signal processing circuit 110. On and off of each IGBT 200# is thus controlled by control of a gate voltage by drive circuit 100.

When motor 60 is operated at a high voltage and a high current, IGBT 200# is turned on by applying a positive voltage approximately from 15 to 16 (V) across the gate and the emitter. At this time, such a drive current as instantaneously exceeding 1 (A) may be required. Therefore, it is difficult for drive circuit 100 to sufficiently directly drive the gate of IGBT 200# in response to a pulse signal from signal processing circuit 110. Therefore, on and off of IGBT 200# is controlled by arranging output circuit 120, amplifying a pulse signal from signal processing circuit 110, and outputting the pulse signal to the gate electrode of the IGBT.

Figure 2:
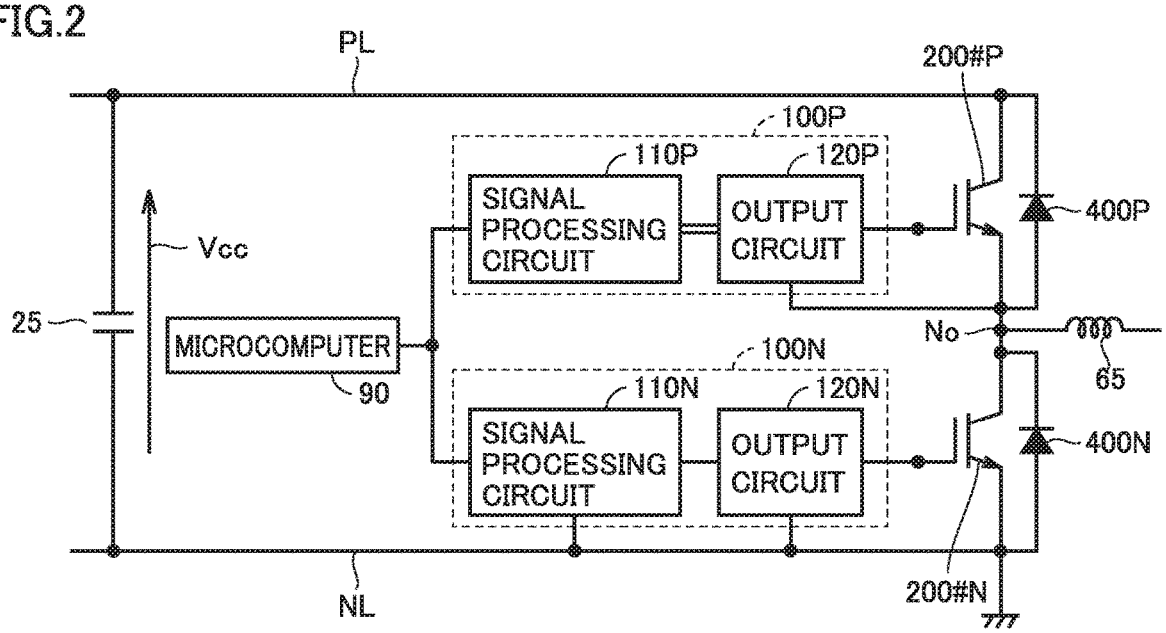
FIG. 2 is a block diagram showing a configuration of a drive circuit in an arm of one phase according to the comparative example.

FIG. 2 shows a configuration for driving an arm of one phase according to the comparative example.

Referring to FIG. 2, an IGBT 200#P on a high voltage side (a P side or a high side) and an IGBT 200#N on a low voltage side (an N side or a low side) implement an arm by being connected in series between power lines PL and NL with an output node No being interposed. Each of IGBTs 200#P and 200#N includes a collector C (positive electrode) and an emitter E (negative electrode) as main electrodes and a gate G as a control electrode.

In the example in FIGS. 1 and 2, output node No corresponding to a node of connection between P-side IGBT 200#P and N-side IGBT 200#N is connected to a coil winding 65. Coil winding 65 corresponds to a coil winding of one phase which is comprehensive denotation of coil windings 65U, 65V, and 65W.

For example, an amplitude (an effective value) and a frequency of an AC voltage of each phase can be controlled by controlling a ratio between on and off periods (what is called a duty ratio) of P-side IGBT 200#P and N-side IGBT 200#N for each predetermined control period in each arm. Thus, motor 60 can be controlled to be driven at a variable speed by controlling drive electric power supplied to motor 60. For example, microcomputer 90 outputs a control command indicating on and off of P-side IGBT 200#P and N-side IGBT 200#N for controlling the duty ratio.

A drive circuit 100P for turning on and off P-side IGBT 200#P in response to an on and off command from microcomputer 90 includes a signal processing circuit 110P and an output circuit 120P. Similarly, a drive circuit 100N for turning on and off N-side IGBT 200#N in response to an on and off command from microcomputer 90 includes a signal processing circuit 110N and an output circuit 120N.

Signal processing circuit 110P outputs a pulse signal for controlling on and off of P-side IGBT 200#P in response to an on and off command from microcomputer 90. Similarly, signal processing circuit 110N outputs a pulse signal for controlling on and off of N-side IGBT 200#N in response to an on and off command from microcomputer 90. Signal processing circuits 110P and 110N each generate a pulse signal in response to an on and off command from microcomputer 90, with addition of a dead time being reflected thereon for avoiding arm short-circuiting which causes simultaneous turn-on of P-side IGBT 200#P and N-side IGBT 200#N and with timing adjustment being reflected thereon for lowering switching loss or surge.

Output circuit 120P controls a voltage of gate G (a gate voltage) with respect to emitter E of P-side IGBT 200#P in accordance with a level of a pulse signal from signal processing circuit 110P. Similarly, output circuit 120N controls a voltage of gate G (a gate voltage) with respect to emitter E of N-side IGBT 200#N in accordance with a level of a pulse signal from signal processing circuit 110N. For example, when a gate voltage is controlled to a positive voltage higher than a threshold voltage, each of IGBTs 200#P and 200#N is turned on. When a gate voltage is set to a zero voltage (that is, emitter E and gate G being equal in potential to each other) on the other hand, each of IGBTs 200#P and 200#N is turned off.

A diode 400P is connected in anti-parallel to P-side IGBT 200#P to form a current path from emitter E toward collector C of P-side IGBT 200#P. Similarly, a diode 400N is connected in anti-parallel to N-side IGBT 200#N to form a current path from emitter E toward collector C of N-side IGBT 200#N. Diodes 400P and 400N are each provided as a free-wheeling diode (FWD) for securing a circulation path for a current generated by energy stored in coil winding 65 during an off operation period of IGBTs 200#P and 200#N.

As power line NL on the low voltage side is grounded, the emitter (negative electrode) of N-side IGBT 200#N is grounded to obtain a zero voltage (GND) as a reference voltage. As N-side IGBT 200#N or P-side IGBT 200#P is turned on, output node No outputs one of a power supply voltage Vcc of power line PL and the zero voltage (GND) to coil winding 65.

Therefore, the voltage of the emitter of N-side IGBT 200#N is fixed to zero volt, whereas a voltage of output node No, that is, the emitter of P-side IGBT 200#P, is considerably varied from zero volt to a positive voltage resulting from addition of a surge voltage to power supply voltage Vcc. As is well known, a surge voltage is determined by a product of an inductance (L) of an interconnection and a rate of change over time in current (di/dt) at the time of switching.

By varying a duty ratio representing a ratio of a period of output of power supply voltage Vcc from output node No in each arm as described above, output from motor 60 can freely be varied. When a short-circuiting accident of motor 60 occurs, IGBT 200# which implements inverter 50 may be damaged by a flow of a short-circuiting current significantly higher than a controllable current. When IGBT 200# loses its function to block a voltage across the collector and the emitter (a withstand voltage) due to damage, power supply voltage Vcc may be applied to output circuit 120P.

There is thus a concern about expansion of electrical damage as a result of application of a high voltage not only to output circuit 120P mainly constituted of general electronic circuits generally not so high in withstand voltage performance but also to a group of circuits electrically connected to output circuit 120.

When two IGBTs 200#P and 200#N which implement an identical arm are simultaneously turned on by an erroneous signal such as noise, power supply voltage Vcc is directly applied to IGBTs 200#P and 200#N without passing through a load such as coil winding 65. Then, a high current may flow and power supply voltage Vcc may be transmitted to the gate electrode.

In general, isolation capability of an IGBT gate is designed on the premise that a voltage is approximately from 15 to 16 (V) as described above. Therefore, when power supply voltage Vcc far exceeding the isolation capability is applied, the gate loses its isolation capability and a high voltage is applied to output circuit 120P in drive circuit 100P. Then, the inside of drive circuit 100P may further be damaged.

In order to minimize such secondary destruction, in general, drive circuit 100P of P-side IGBT 200#P in which a high voltage is constantly applied to the collector (positive electrode) is generally structured to electrically isolate output circuit 120P electrically connected to the gate electrode from signal processing circuit 110P. For example, an isolation structure can be implemented by a photocoupler, an isolating transformer, or a device with a function to isolate a semiconductor element with high-voltage blocking capability. By interposing such an isolation element as the isolation structure into a signal transmission path between signal processing circuit 110P and output circuit 120P, a high voltage at the time of occurrence of an abnormal condition is born by the isolation element to avoid application of the high voltage to signal processing circuit 110P. Expansion of damage can thus be prevented.

N-side IGBT 200#N, on the other hand, has the emitter (negative electrode) serving as the reference for a gate voltage grounded, and hence an operation thereby is more stable than the operation by P-side IGBT 200#P. Therefore, from a point of view of increase in cost by adoption of the isolation structure, output circuit 120N and signal processing circuit 110N are not electrically isolated from each other in general in N-side drive circuit 100N, excluding an inverter for a high-reliability application. In an arm configuration implemented by IGBT 200# including a single gate electrode, an electrical isolation structure including an isolation element is provided in the P-side drive circuit whereas such an isolation structure is not provided in the N-side drive circuit, so that prevention of secondary destruction at the time of occurrence of an abnormal condition and increase in manufacturing cost are generally balanced.

In contrast, a configuration of a drive circuit in an arm configuration implemented by a semiconductor switching element of a double-gate structure including a plurality of gate electrodes (control electrodes) will be described in the present embodiment.

Figure 3:
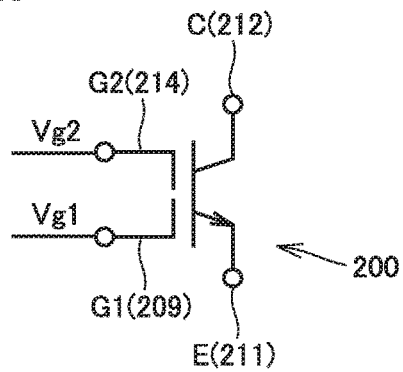
FIG. 3 is a symbol diagram of a semiconductor switching element (IGBT) of a double-gate structure applied to the arm configuration according to the present embodiment.

FIG. 3 shows a symbol diagram of a semiconductor switching element (IGBT) 200 of a double-gate structure applied to the arm configuration according to the present embodiment. Semiconductor switching element 200 is also denoted as IGBT 200 below.

Referring to FIG. 3, IGBT 200 includes collector C (positive electrode) and emitter E (negative electrode) as main electrodes similarly to IGBT 200# described in the comparative example. IGBT 200 further includes a first gate G1 and a second gate G2 as a plurality of control electrodes. In the following, a collector voltage Vce is defined as a voltage of collector C with respect to emitter E, a first gate voltage Vg1 is defined as a voltage of first gate G1 with respect to emitter E, and a second gate voltage Vg2 is defined as a voltage of second gate G2 with respect to collector C. IGBT 200 of the double-sided-gate structure can be constructed, for example, by a double-gate structure shown in FIG. 4. In general, an IGBT of a double-sided-gate structure has been known to achieve improvement in tradeoff between an on voltage and switching loss.

Figure 4:
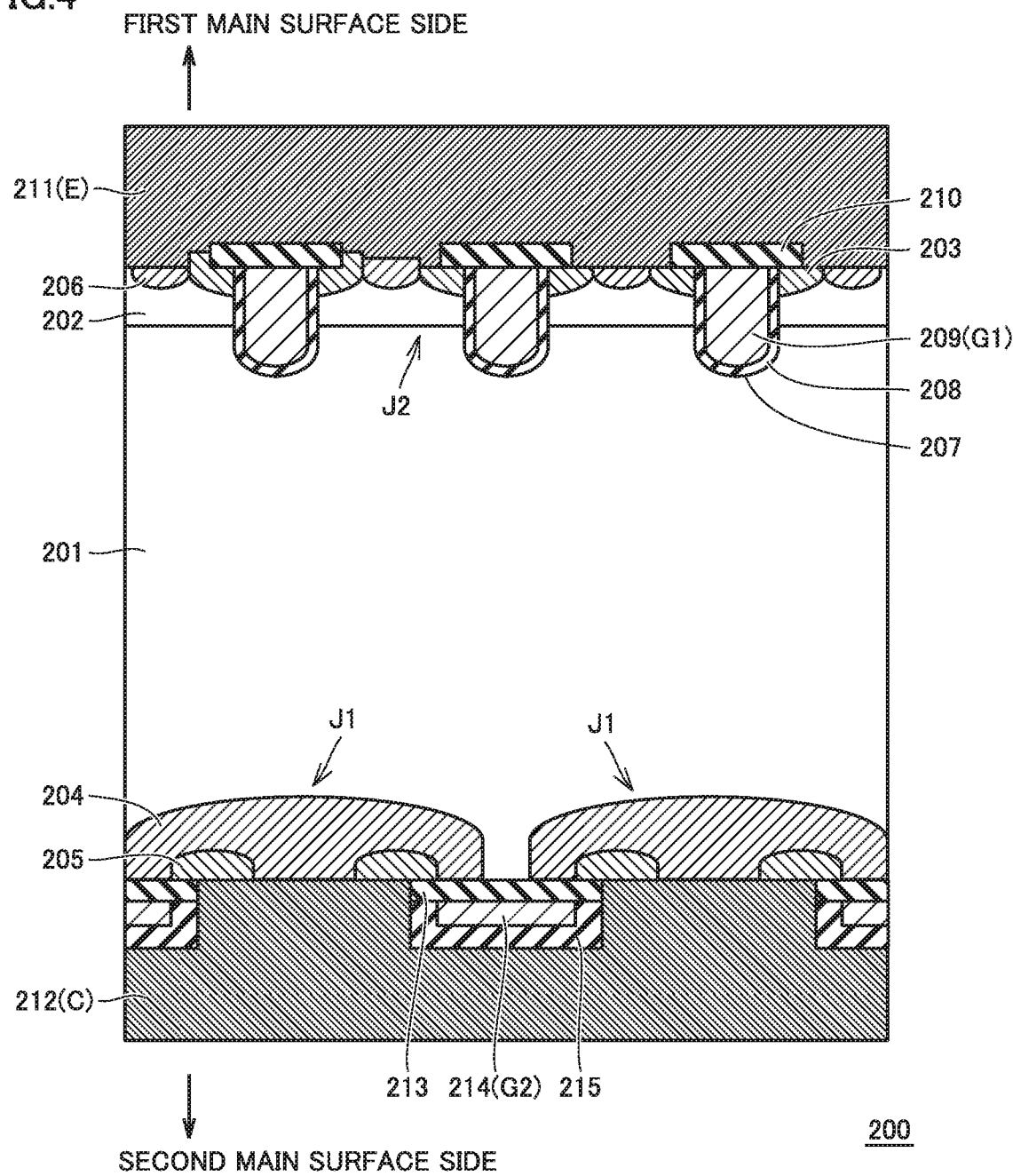
FIG. 4 is a cross-sectional view for illustrating one example of a structure of the IGBT shown in FIG. 3.

FIG. 4 is a cross-sectional view for illustrating one example of a structure of the IGBT shown in FIG. 3.

Referring to FIG. 4, IGBT 200 includes a double-sided-gate structure and includes an n base 201 including first and second main surfaces, a p base 202, an n emitter 203, a p collector 204, an n collector 205, a p emitter 206, a trench 207, a first gate insulating film 208, a first gate electrode 209, a first gate interlayer insulating film 210, an emitter electrode 211, a collector electrode 212, a second gate insulating film 213, a second gate electrode 214, and a second gate interlayer insulating film 215.

Emitter electrode 211 is formed of a conductor (representatively a metal) on a surface on a first main surface side of IGBT 200. Similarly, collector electrode 212 is formed of a conductor (representatively a metal) on a surface on a second main surface side of IGBT 200. Emitter electrode 211 corresponds to emitter E (negative electrode) in FIG. 3 and collector electrode 212 corresponds to collector C (positive electrode) in FIG. 3.

P base 202 is disposed on the first main surface side of n base 201. P emitter 206 at a high concentration is selectively provided in a surface of p base 202 (on the first main surface side) for establishing good Ohmic contact with emitter electrode 211. N emitter 203 is selectively disposed in a partial region in p base 202 on the first main surface side.

Trench 207 is provided on the first main surface side of IGBT 200 to reach n base 201 through n emitter 203 and p base 202. First gate insulating film 208 is formed on a surface of trench 207. In the inside of trench 207, first gate electrode 209 is formed representatively of polysilicon on first gate insulating film 208 (on the first main surface side). First gate interlayer insulating film 210 is formed between emitter electrode 211, and trench 207 and n emitter 203. A first gate portion of an enhancement n-channel metal oxide semiconductor field effect transistor (MOSFET) structure is thus formed on an emitter side of the first main surface.

P collector 204 is disposed on the second main surface side of n base 201. N collector 205 is selectively disposed in a partial region in p collector 204 on the second main surface side. By forming second gate insulating film 213, second gate electrode 214, and second gate interlayer insulating film 215 in FIG. 1, a second gate portion of an enhancement n-channel MOSFET structure is also formed on a collector side of the second main surface.

First gate insulating film 208 and second gate insulating film 213 are normally formed from an oxide film (representatively $SiO_2$). First gate electrode 209 and second gate electrode 214 are representatively composed of polysilicon doped with an n-type impurity.

IGBT 200 thus includes first gate electrode 209 and second gate electrode 214 which function as control electrodes on the first main surface side and the second main surface side opposed to the first main surface side (that is, on double sides), respectively. First gate electrode 209 corresponds to first gate G1 in FIG. 3 and second gate electrode 214 corresponds to second gate G2 in FIG. 3.

Operations by IGBT 200 of the double-sided-gate structure will now be described. Operations by IGBT 200 are controlled by first gate voltage Vg1 applied to first gate electrode 209 and second gate voltage Vg2 applied to second gate electrode 214.

In the arm configuration described with reference to FIG. 2, a positive voltage (Vce>0) is applied to emitter electrode 211 and collector electrode 212. Under the condition of Vce>0, on and off of IGBT 200 is controlled by first gate voltage Vg1 on the emitter side. Specifically, when first gate voltage Vg1 is set to a positive voltage exceeding a threshold voltage Vt (which is denoted as Vg1="+"), IGBT 200 enters a forward current conduction state (which is also simply referred to as an "on state" below) which is a state that a high current flows from collector electrode 212 to emitter electrode 211 even though collector voltage Vce is low regardless of whether second gate voltage Vg2 on the collector side is set to the positive voltage (which is denoted as Vg2="+") or no positive voltage is applied (which is denoted as Vg2="0").

On the other hand, when a condition of first gate voltage Vg1="0" is satisfied, that is, no positive voltage is applied to first gate electrode 209, IGBT 200 enters a voltage blocking state (which is also simply referred to as an "off state" below) in which no current flows from collector electrode 212 to emitter electrode 211 under the condition of Vce>0, regardless of whether second gate voltage Vg2 is set to "+" or "0".

In particular, when first gate voltage Vg1 is set to Vg1="+" and second gate voltage Vg2 is set to Vg2="0", a region in p base 202 in the vicinity of first gate electrode 209 is inverted to an n-type so that an n-channel (a first n-channel) is formed and a current path from n emitter 203 through the first n-channel to n base 201 is formed. Electrons (negative charges) are injected from emitter electrode 211 through the path into n base 201.

As n base 201 is negatively charged by injected electrons, a pn junction formed by p collector 204 and n base 201 (which is also referred to as a "J1 junction" below) is forward biased. Holes (positive charges) are thus injected from collector electrode 212 through p collector 204 into n base 201.

Consequently, a density of holes present in n base 201 increases and conductivity modulation occurs, so that resistive components in n base 201 significantly decrease. IGBT 200 thus enters the on state. Lowering in voltage across the collector and the emitter of IGBT 200 at this time corresponds to what is called an on voltage.

A turn-off switching operation to make transition from the on state to the voltage blocking state (off state) will now be described.

When first gate voltage Vg1 is set to Vg1="0" and second gate voltage Vg2 is set to Vg2="0" under the condition of Vce>0, the region in p base 202 in the vicinity of first gate electrode 209 which has been inverted to the n-type and has been forming the first n-channel while the condition of Vg1="+" has been satisfied returns to a p-type. There is thus no longer a path for electrons to flow from n emitter 203 to n base 201, so that injection of electrons from emitter electrode 211 into n base 201 is stopped. Forward bias to the J1 junction formed by p collector 204 and n base 201 is thus removed and injection of holes from collector electrode 212 through p collector 204 into n base 201 is stopped.

Consequently, conductivity modulation of n base 201 during an on operation period is eliminated and a resistance of an base 201 returns to a state before occurrence of conductivity modulation. Furthermore, a pn junction formed by p base 202 and n base 201 (which is also referred to as a "J2 junction" below) is depleted. Thus, IGBT 200 enters the voltage blocking state (off state) in which no current flows from collector electrode 212 to emitter electrode 211 under the condition of Vce>0.

In particular, in the turn-off switching operation by IGBT 200, by applying a prescribed positive voltage to second gate electrode 214 on the collector side immediately before or substantially simultaneously with stop of application of the positive voltage to first gate electrode 209 on the emitter side to thereby invert the region in the vicinity of second gate electrode 214 to the n-type to form a second n-channel, a current path defined by n base 201-the second n-channel-n collector 205 is formed. Electrons are thus emitted from n base 201 to collector electrode 212 so that a density of electrons in n base 201 starts to lower. Such lowering in density of electrons weakens forward bias to the pn junction (the J1 junction) formed by p collector 204 and n base 201 so that injection of holes from p collector 204 into n base 201 is decreased.

Under such a condition, by switching a positive voltage applied to first gate electrode 209 to a zero volt, the first n-channel inverted to the n-type returns to the p-type and injection of electrons from emitter electrode 211 stops. Electrons accumulated in n base 201, on the other hand, escape from the second n-channel through n collector 205 to collector electrode 212. Similarly, holes accumulated in n base 201 escape from p base 202 through p emitter 206 to emitter electrode 211. Furthermore, owing to depletion layer electric field generated by depletion of the pn junction (J2 junction) formed by p base 202 and n base 201, emission of electrons and holes accumulated in n base 201 to collector electrode 212 and emitter electrode 211 described above is accelerated.

Thus, in the turn-off operation, loss in turn-off switching can be reduced by an effect of reduction in time until disappearance of excessive charges accumulated in n base 201 by setting second gate voltage Vg2 on the collector side to Vg2="+" immediately before (or substantially simultaneously with) variation in first gate voltage Vg1 on the emitter side from "+" to "0".

By setting first gate voltage Vg1 to Vg1="0" as described above, IGBT 200 enters the off state (voltage blocking state). When n base 201 and collector electrode 212 are rendered conducting by maintaining the second gate in the on state by applying a positive voltage to second gate electrode 214 (Vg2="+") during the off operation period of the IGBT, the pn junction (J2 function) formed by p base 202 and n base 201 can function as a diode connected between emitter electrode 211 and collector electrode 212. Therefore, IGBT 200 of the double-sided-gate structure can secure a path for a reverse current without externally connecting diode (FWD: Free Wheeling Diode) 400 as in IGBT 200# in the comparative example.

The IGBT of the double-sided-gate structure can thus function as a semiconductor switching element having an FWD equivalently embedded by controlling first gate voltage Vg1 and second gate voltage Vg2. On the other hand, a plurality of control electrodes (gates) are provided. Therefore, when an arm is implemented by IGBT 200 of the double-gate structure, for example, when inverter 50 is implemented by applying IGBT 200 of the double-gate structure instead of IGBT 200# of a single-gate structure in the power conversion system in FIG. 1, specifications for electrical isolation in the drive circuit different from those in the comparative example (FIG. 2) should be determined. Specifically, such isolation specifications that prevention of secondary destruction on a side of the drive circuit of IGBT 200 of the double-gate structure in spite of application of a high voltage at the time of occurrence of an abnormal condition to the drive circuit and increase in manufacturing cost are balanced are required.

Figure 5:
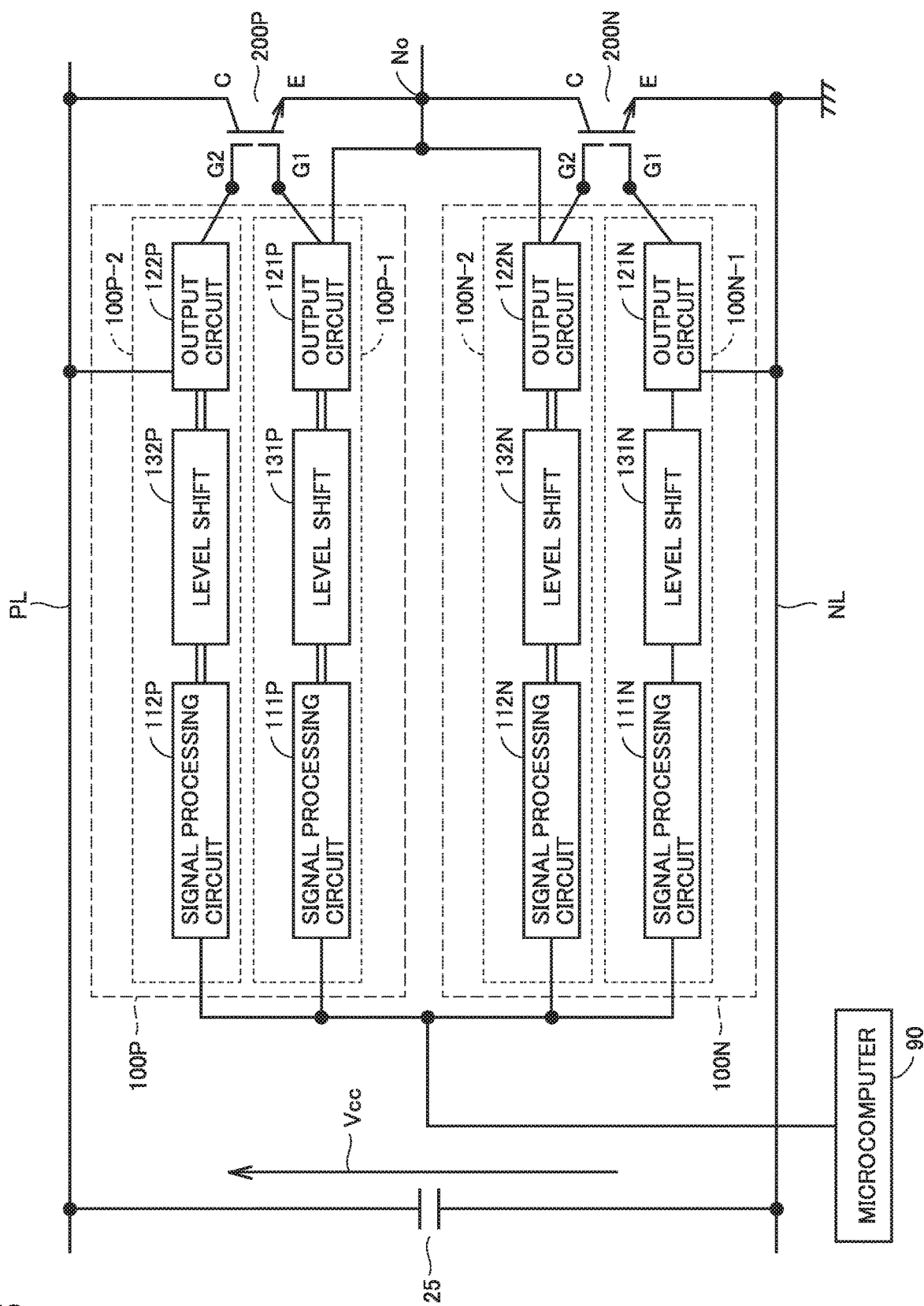
FIG. 5 is a block diagram showing a configuration of a drive circuit in an arm of one phase according to a first embodiment.

FIG. 5 is a block diagram showing a configuration of a drive circuit in an arm of one phase according to a first embodiment. In FIG. 5, the arm is implemented by IGBT 200 of the double-gate structure.

Referring to FIG. 5, an IGBT 200P on the high-voltage side (the P-side or the high side) and an IGBT 200N on the low voltage side (the N-side or the low side) implement an arm by being connected in series between power lines PL and NL with output node No being interposed. Each of IGBTs 200P and 200N includes collector C (positive electrode) and emitter E (negative electrode) as main electrodes and first gate G1 and second gate G2 as control electrodes as described with reference to FIG. 3.

Output node No is connected, for example, to coil winding 65 of motor 60 as in FIG. 2. Therefore, microcomputer 90 can generate an on and off command for turning on and off P-side IGBT 200P and N-side IGBT 200N in each arm in accordance with control of a duty ratio as described with reference to FIG. 2.

Drive circuit 100P for turning on and off P-side IGBT 200P in response to an on and off command from microcomputer 90 includes a drive circuit unit 100P-1 for driving first gate G1 and a drive circuit unit 100P-2 for driving second gate G2. Drive circuit unit 100P-1 includes a signal processing circuit 111P, an output circuit 121P, and a level shift circuit 131P. Similarly, drive circuit unit 100P-2 includes a signal processing circuit 112P, an output circuit 122P, and a level shift circuit 132P.

Signal processing circuit 111P outputs a pulse signal for controlling first gate voltage Vg1 of P-side IGBT 200P. The pulse signal is a binary signal for indicating a period during which the condition of Vg1="+" is to be satisfied and a period during which the condition of Vg1="0" is to be satisfied as described above. Similarly, signal processing circuit 112P outputs a pulse signal for controlling second gate voltage Vg2 of P-side IGBT 200P. The pulse signal is a binary signal for indicating a period during which the condition of Vg2="+" is to be satisfied and a period during which the condition of Vg2="0" is to be satisfied as described above.

Signal processing circuits 111P and 112P generate pulse signals described above to control first gate voltage Vg1 and second gate voltage Vg2 to turn on and off P-side IGBT 200P in response to an on and off command from microcomputer 90. Addition of a dead time described above and timing adjustment for reducing switching loss or surge are reflected on the pulse signal.

The pulse signals output from signal processing circuits 111P and 112P are transmitted to output circuits 121P and 122P through level shift circuits 131P and 132P, respectively. Output circuit 121P regards a voltage of the emitter (negative electrode) of P-side IGBT 200, that is, output node No, as a reference voltage, and controls first gate voltage Vg1 with respect to the emitter of P-side IGBT 200P to any of "0" and "+" in accordance with an output from level shift circuit 131P.

Output circuit 122P regards a voltage of the collector (positive electrode) of P-side IGBT 200, that is, power line PL, as a reference voltage, and controls second gate voltage Vg2 with respect to the collector of P-side IGBT 200P to any of "0" and "+" in accordance with an output from level shift circuit 132P.

Similarly, drive circuit 100N for turning on and off N-side IGBT 200N in response to an on and off command from microcomputer 90 includes a drive circuit unit 100N-1 for driving first gate G1 and a drive circuit unit 100N-2 for driving second gate G2. Drive circuit unit 100N-1 includes a signal processing circuit 111N, an output circuit 121N, and a level shift circuit 131N. Similarly, drive circuit unit 100N-2 includes a signal processing circuits 112N, an output circuit 122N, and a level shift circuit 132N.

Signal processing circuits 111N and 112N output pulse signals for controlling first gate voltage Vg1 and second gate voltage Vg2 of N-side IGBT 200N. The pulse signals from signal processing circuits 111N and 112N are binary signals similar to the pulse signals from signal processing circuits 111P and 112P. Signal processing circuits 111N and 112N generate the pulse signals described above for controlling first gate voltage Vg1 and second gate voltage Vg2 to turn on and off N-side IGBT 200N in response to an on and off command from microcomputer 90, similarly to signal processing circuits 111P and 112P. Addition of a dead time described above and timing adjustment for reducing switching loss or surge are reflected on the pulse signal.

The pulse signals output from signal processing circuits 111N and 112N are transmitted to output circuits 121N and 122N through level shift circuits 131N and 132N, respectively. Output circuit 121N regards a voltage of the emitter (negative electrode) of N-side IGBT 200, that is, power line NL, as a reference voltage, and controls first gate voltage Vg1 with respect to the emitter of N-side IGBT 200N to any of "0" and "+" in accordance with an output from level shift circuit 131N.

Output circuit 122N regards a voltage of the collector (positive electrode) of N-side IGBT 200, that is, output node No, as a reference voltage, and controls second gate voltage Vg2 with respect to the collector of N-side IGBT 200N to any of "0" and "+" in accordance with an output from level shift circuit 132N.

In the arm configuration in FIG. 5 as well, a voltage of output node No in response to turning on and off P-side IGBT 200P and N-side IGBT 200N is the same as in FIG. 2. Therefore, a gate voltage with power supply voltage Vcc being defined as the reference is applied to second gate G2 of P-side IGBT 200P. Since the gate voltage is controlled with output node No being defined as the reference, there is a period during which the gate voltage with power supply voltage Vcc being defined as the reference is applied to first gate G1 of P-side IGBT 200P and second gate G2 of N-side IGBT 200N. Gate voltage Vg1 of N-side IGBT 200N, on the other hand, is generated with a voltage (GND) of the emitter (negative electrode) fixed to GND being defined as the reference.

Therefore, in the arm configuration in FIG. 5, output circuit 121P and signal processing circuit 111P for first gate G1 of P-side IGBT 200P are electrically isolated from each other by level shift circuit 131P and output circuit 122P and signal processing circuit 112P for second gate G2 are electrically isolated from each other by level shift circuit 132P. Output circuit 122N and signal processing circuit 112N for second gate G2 of N-side IGBT 200N are also electrically isolated from each other by level shift circuit 132N. Level shift circuit 131N connected between output circuit 121N and signal processing circuit 111N for first gate G1 of N-side IGBT 200N, on the other hand, can be configured not to include an isolation structure. In FIG. 5, connection through which a signal can be transmitted under electrical isolation is denoted by a double line and electrical connection is denoted by a solid line.

In FIG. 5, P-side IGBT 200P corresponds to one example of the "first semiconductor switching element" and N-side IGBT 200N corresponds to one example of the "second semiconductor switching element." Collector C of P-side IGBT 200P corresponding to the "first semiconductor switching element" corresponds to one example of the "first positive electrode," emitter E corresponds to one example of the "first negative electrode," first gate G1 corresponds to one example of the "first control electrode," and second gate G2 corresponds to one example of the "second control electrode." Similarly, collector C of N-side IGBT 200N corresponding to the "second semiconductor switching element" corresponds to one example of the "second positive electrode," emitter E corresponds to one example of the "second negative electrode," first gate G corresponds to one example of the "third control electrode," and second gate G2 corresponds to one example of the "fourth control electrode."

Drive circuit 100P of P-side IGBT 200P corresponds to one example of the "first drive circuit," drive circuit unit 100P-1 corresponds to one example of the "first drive circuit unit," and drive circuit unit 100P-2 corresponds to one example of the "second drive circuit unit." Similarly, drive circuit 100N of N-side IGBT 200N corresponds to one example of the "second drive circuit," drive circuit unit 100N-1 corresponds to one example of the "third drive circuit unit," and drive circuit unit 100N-2 corresponds to one example of the "fourth drive circuit unit."

Figure 6:
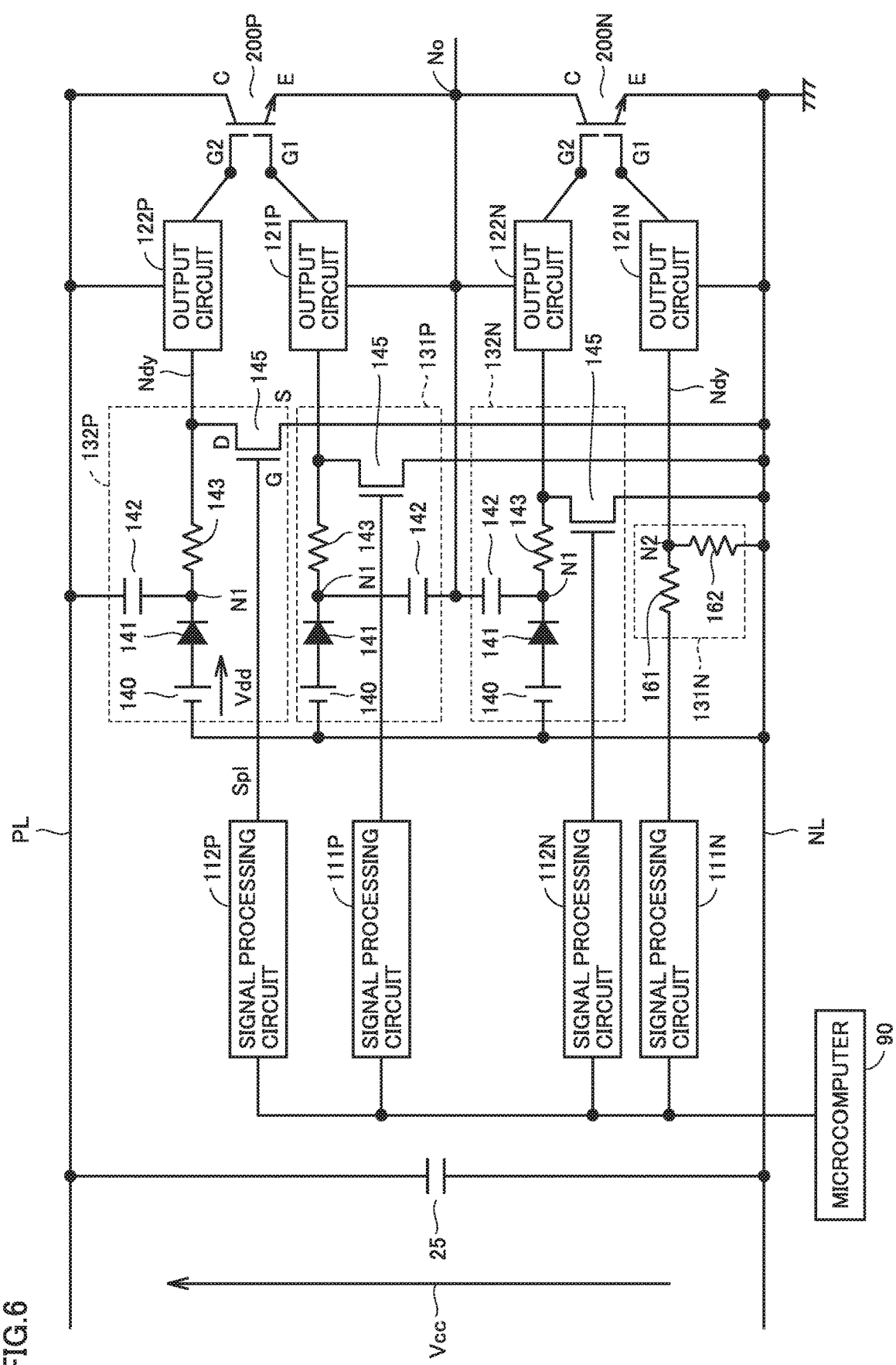
FIG. 6 is a circuit diagram illustrating an exemplary configuration of a level shift circuit shown in FIG. 5.

FIG. 6 is a circuit diagram illustrating an exemplary configuration of the level shift circuit shown in FIG. 5.

Referring to FIG. 6, each of level shift circuits 131P, 132P, and 132N includes a DC power supply 140, a diode 141, a capacitor 142, a resistive element 143, and an NMOS transistor 145. FIG. 6 representatively illustrates a circuit configuration of level shift circuit 132P.

DC power supply 140 and diode 141 are connected in series between power line NL (GND) on the low voltage side and a node N1. The negative electrode of DC power supply 140 is electrically connected to power line NL and diode 141 is connected with a direction from the positive electrode of DC power supply 140 toward node N1 being defined as a forward direction. DC power supply 140 outputs a DC voltage Vdd higher than threshold voltage Vt of IGBT 200. As described above, DC voltage Vdd is generally set to 15 to 16 (V). Capacitor 142 is connected between node N1 and power line PL on the high voltage side.

Resistive element 143 is connected between an input node Ndy of output circuit 122P and node N1. NMOS transistor 145 is electrically connected between power line NL (GLD) on the low voltage side and input node Ndy. Namely, NMOS transistor 145 has a source (S) connected to power line NL (GLD) and a drain (D) connected to input node Ndy. A gate (G) of NMOS transistor 145 receives input of a pulse signal Sp1 output from signal processing circuit 112P.

Figure 7:
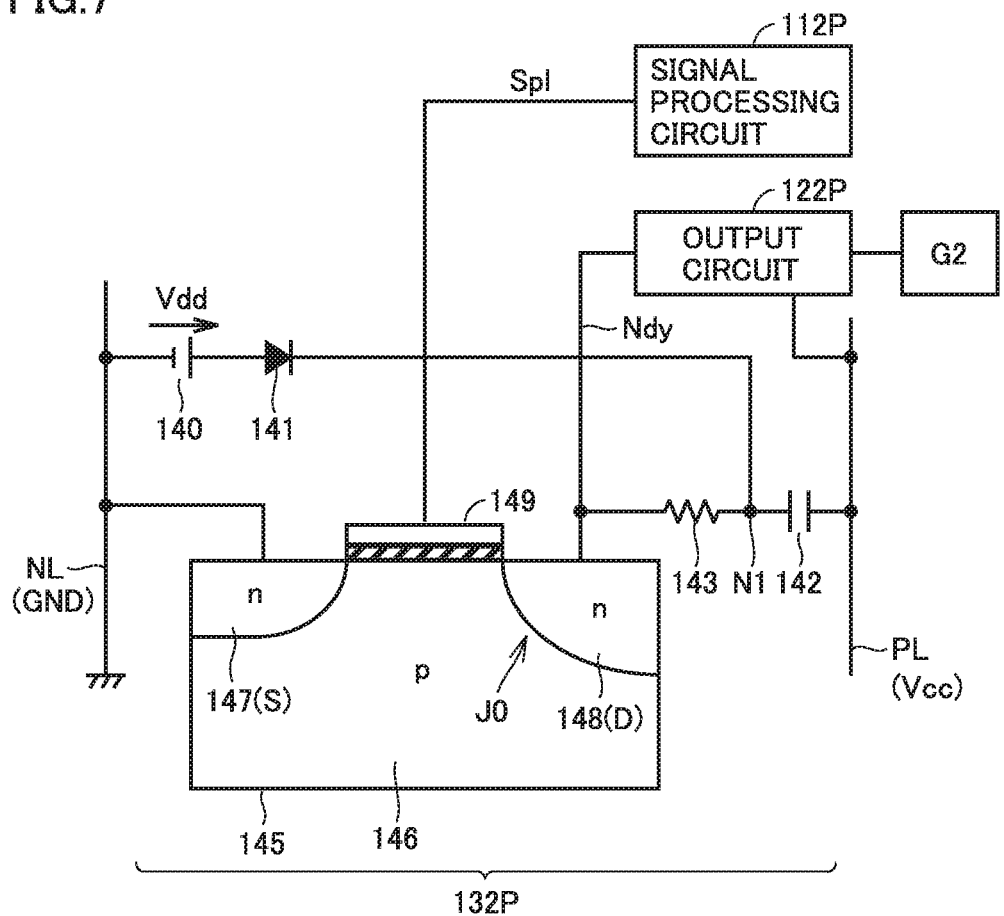
FIG. 7 is a conceptual cross-sectional view of an NMOS transistor in FIG. 6.

FIG. 7 shows a conceptual cross-sectional view of NMOS transistor 145.

Referring to FIG. 7, NMOS transistor 145 includes n-type regions 147 and 148 and a gate electrode 149 formed on a p-type region 146. N-type region 147 is electrically connected to power line NL and functions as the source (S). N-type region 148 is connected to input node Ndy of output circuit 122P and connected to node N1 with resistive element 143 being interposed. N-type region 148 functions as the drain (D). Gate electrode 149 is formed on a channel region formed between n-type regions 147 and 148, with a gate insulating film being interposed. Gate electrode 149 receives input of pulse signal Sp1 output from signal processing circuit 112P.

Since NMOS transistor 145 is turned off while pulse signal Sp1 representing a binary signal is at a logic low level (simply the "L level" below), DC voltage Vdd from DC power supply 140 is input to input node Ndy of output circuit 122P through diode 141 and resistive element 143. Output circuit 122P thus drives second gate G2 to a voltage calculated as a sum of the voltage of power line PL (power supply voltage Vcc) defined as the reference voltage and Vdd (V). A state that second gate voltage Vg2 is set to Vg2="+" can thus be set.

As NMOS transistor 145 is turned on while pulse signal Sp1 is at a logic high level (simply the "H level" below), conduction between input node Ndy of output circuit 122P and power line NL on the low voltage side is achieved. Thus, GND is input to output circuit 122P and output circuit 122P drives second gate G2 to a voltage calculated as the voltage of power line PL (power supply voltage Vcc) defined as a sum of the reference voltage and 0 (V). A state that second gate voltage Vg2 is set to Vg2="0" can thus be set.

In NMOS transistor 145, p-type region 146 and n-type region 148 form a pn junction (a J0 junction). Even though a high voltage from output circuit 122P is applied to NMOS transistor 145 at the time of occurrence of an abnormal condition, a withstand voltage by reverse biasing of the J0 junction can prevent transmission of the high voltage to p-type region 146. Secondary destruction by application of a high voltage to signal processing circuit 112P with destruction of a gate insulating film can thus be prevented. Namely, the pn junction (J0 junction) of NMOS transistor 145 can electrically isolate and separate output circuit 122P and signal processing circuit 112P from each other. Thus, the J0 junction corresponds to one example of the "pn junction of a semiconductor element" for implementing the "isolation structure" and NMOS transistor 145 corresponds to one example of the "field effect transistor."

Referring again to FIG. 6, output circuit 121P connected to first gate G1 of P-side IGBT 200P is connected to signal processing circuit 111P with level shift circuit 131P configured similarly to level shift circuit 132P being interposed. Therefore, for output circuit 121P as well, first gate voltage Vg1 can be controlled to Vg1="+" or "0" with a voltage of the emitter of P-side IGBT 200P (that is, a voltage of output node No) being defined as the reference, in accordance with a pulse signal from signal processing circuit 111P.

Similarly, output circuit 122N connected to second gate G2 of N-side IGBT 200N is connected to signal processing circuit 112N with level shift circuit 132N configured similarly to level shift circuit 132P being interposed. Therefore, output circuit 122N can control second gate voltage Vg2 to Vg2="+" or "0" with a voltage of the collector of N-side IGBT 200N (that is, a voltage of output node No) being defined as the reference, in accordance with a pulse signal from signal processing circuit 112N.

Capacitor 142 in each of level shift circuits 131P and 132N is connected between output node No and node N1. The pn junction (the J0 junction in FIG. 7) in NMOS transistor 145, also in each of level shift circuits 131P and 132N, electrically isolates and separates output circuit 121P and signal processing circuit 111P from each other and electrically isolates and separates output circuit 122N and signal processing circuit 111N from each other.

Since the emitter of N-side IGBT 200N is grounded and the voltage thereof is stable, it is not highly required to provide an isolation structure between output circuit 121N and signal processing circuit 111N for supplying a gate voltage with the emitter being defined as the reference. Therefore, level shift circuit 131N electrically connects signal processing circuit 111N and output circuit 121N to each other without an isolation structure.

Level shift circuit 131N including no isolation structure can be implemented, for example, by resistive elements 161 and 162. Resistive element 161 is connected between an output node of signal processing circuit 111N and a node N2. Resistive element 162 is connected between node N2 and power line NL (GND). Node N2 is connected to input node Ndy of output circuit 121. Consequently, a binary voltage signal (at the H level or the L level) resulting from voltage division of a pulse signal output from signal processing circuit 111N by resistive elements 161 and 162 is input to input node Ndy of output circuit 121.

For example, when the pulse signal is at the H level, output circuit 121N drives first gate G1 of N-side IGBT 200N to a voltage calculated as a sum of ground voltage GND defined as the reference voltage and Vdd (V). Thus, a state that first gate voltage Vg1 is set to Vg1="+" can be set. In contrast, when the pulse signal is at the L level, output circuit 121N drives first gate G1 of N-side IGBT 200N to ground voltage GND.

Thus, according to the configuration of the drive circuit in the arm configuration according to the first embodiment shown in FIGS. 5 and 6, in the drive circuit units for both of first gate G1 and second gate G2 of P-side IGBT 200P and second gate G2 of N-side IGBT 200N to which power supply voltage Vcc of power line PL on the high voltage side may be applied, signal processing circuits 111P, 112P, and 112N are electrically isolated and separated from output circuits 121P, 122P, and 122N by level shift circuits 131P, 132P, and 132N provided with the isolation structures, respectively.

Therefore, even though power supply voltage Vcc is transmitted to output circuits 121P, 122P, and 122N at the time of occurrence of an abnormal condition in IGBTs 200P and 200N of the double-gate structure, the isolation and separation can prevent the power supply voltage from transmitting to signal processing circuits 111P, 112P, and 112N. Consequently, secondary destruction of signal processing circuits 111P, 112P, and 112N can be avoided.

Level shift circuit 131N configured not to include an isolation element is connected between output circuit 121N and signal processing circuit 111N for first gate G1 of N-side IGBT 200N which supplies a gate voltage with ground voltage GND being defined as the reference. Manufacturing cost can thus be suppressed by minimizing the isolation structure.

By implementing an isolation structure in each of level shift circuits 131P, 132P, and 132N based on voltage blocking characteristics of a pn junction in a semiconductor element such as an NMOS transistor, the isolation structure can readily be incorporated in a semiconductor device such as an integrated circuit (IC). Consequently, a level shift circuit which inexpensively secures isolation and separation between a signal processing circuit and an output circuit can be operated by a low-voltage power supply.

Since the emitter (negative electrode) of P-side IGBT 200P is equal in potential to the collector (positive electrode) of N-side IGBT 200N in the configuration in FIG. 6, it is difficult to achieve isolation and separation between output circuit 121P for first gate G1 of P-side IGBT 200P and output circuit 122N for second gate G2 of N-side IGBT 200N even by providing an isolation structure therebetween.

In the configuration in FIG. 6, however, by arranging level shift circuits 131P and 132N, NMOS transistor 145 can isolate and separate signal processing circuit 111P and output circuit 121P from each other and isolate and separate signal processing circuit 112N and output circuit 122N from each other as described above, and additionally a reverse voltage blocking function of diode 141 can electrically isolate and separate output circuit 122N and signal processing circuit 111P from each other and electrically isolate and separate output circuit 121P and signal processing circuit 112N from each other. Capacitor 142 in each of level shift circuits 131P and 132N can partially electrically separate a drive portion (drive circuit unit 100P-1 in FIG. 5) for first gate G1 of P-side IGBT 200P and a drive portion (drive circuit unit 100N-2 in FIG. 5) for second gate G2 of N-side IGBT 200N from each other.

Consequently, the isolation structure can be provided such that damage in P-side IGBT 200P (mainly generation of a high voltage) does not affect the drive portion (drive circuit unit 100N-2 in FIG. 5) for second gate G2 of N-side IGBT 200N or such that damage in N-side IGBT 200N (mainly generation of a high voltage) does not affect the drive portion (drive circuit unit 100P-1 in FIG. 5) for first gate G1 of P-side IGBT 200P to the contrary.

Though the semiconductor device according to the present invention includes as components, two drive circuits (for example, drive circuits 100P and 100N in FIG. 5) for two semiconductor switching elements (for example, P-side IGBT 200P and N-side IGBT 200N in FIG. 5) which implement an arm, the two drive circuits may be integrated with or separate from each other. Each drive circuit may be modularized by being integrated with a corresponding semiconductor switching element. Alternatively, two semiconductor switching elements and two drive circuits for implementing one arm may be contained in an identical module as the integrated structure (that is, a single module).

Modification of First Embodiment

A modification of a configuration of the level shift circuit will be described in a modification of the first embodiment.

Figure 8:
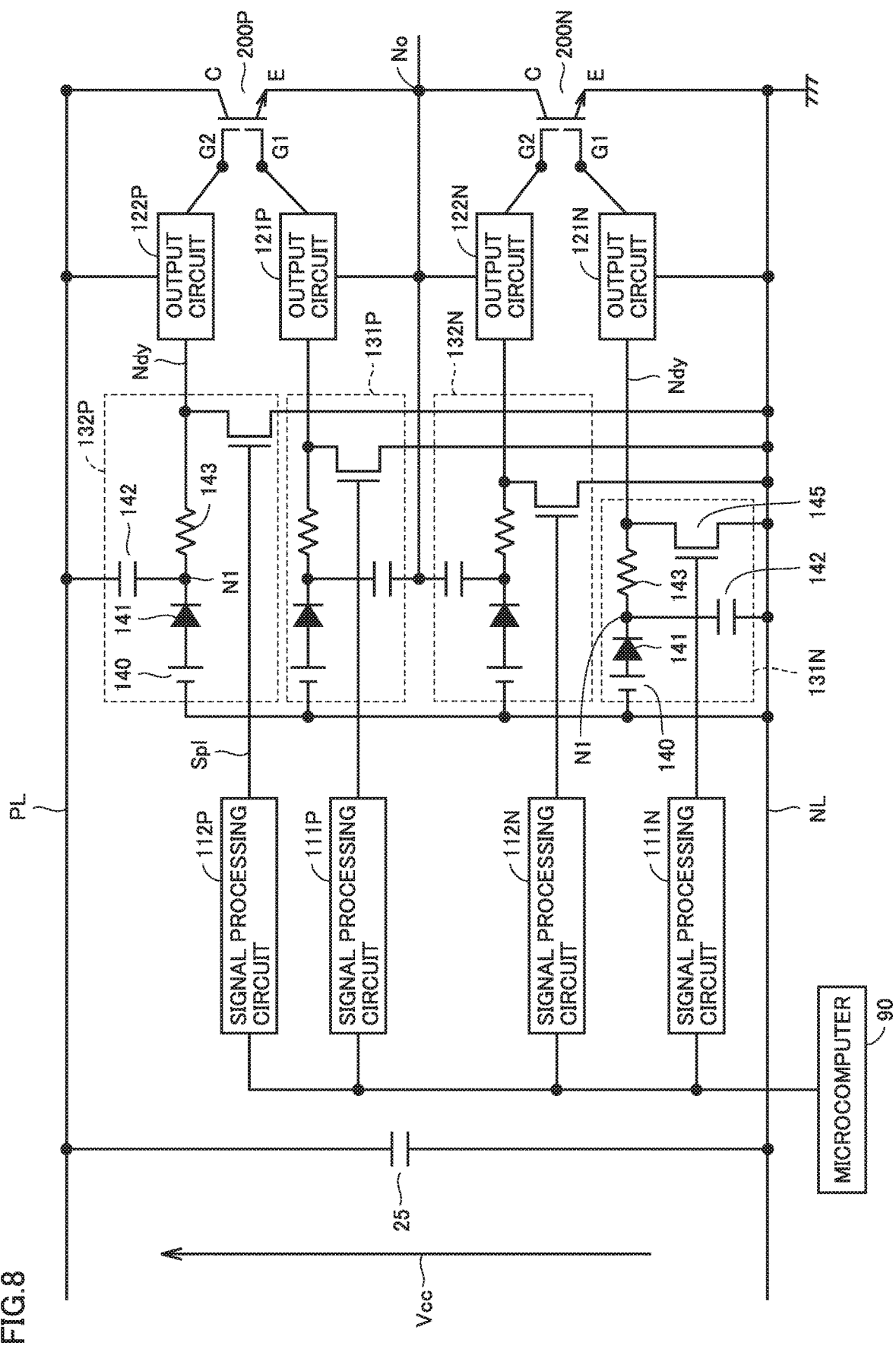
FIG. 8 is a circuit diagram illustrating a first exemplary configuration of the level shift circuit according to a modification of the first embodiment.

FIG. 8 is a circuit diagram illustrating a first exemplary configuration of the level shift circuit according to the modification of the first embodiment.

Based on comparison of FIG. 8 with FIG. 6, in the first exemplary configuration of the level shift circuit according to the modification of the first embodiment, level shift circuit 131N connected between signal processing circuit 111N and output circuit 121N for first gate G1 of N-side IGBT 200N is the same in circuit configuration as other level shift circuits 131P, 132P, and 132N.

Specifically, level shift circuit 131N includes DC power supply 140, diode 141, capacitor 142, resistive element 143, and NMOS transistor 145. Capacitor 142 is connected between node N1 and power line NL on the low voltage side.

According to the configuration in FIG. 8, manufacturing cost increases due to increase in number of isolation structures, whereas level shift circuits 131P, 132P, 131N, and 132N are identical to one another in circuit configuration. Therefore, a configuration for driving gates can be in common between P-side IGBT 200P and N-side IGBT 200N and between the first gate and the second gate. Namely, drive circuit units 100P-1, 100P-2, 100N-1, and 100N-2 shown in FIG. 5 can be manufactured under the same specifications. Manufacturing cost can be reduced in an aspect of common design and parts. During manufacturing, errors in operations for attaching a drive circuit unit can also be suppressed.

Figure 9:
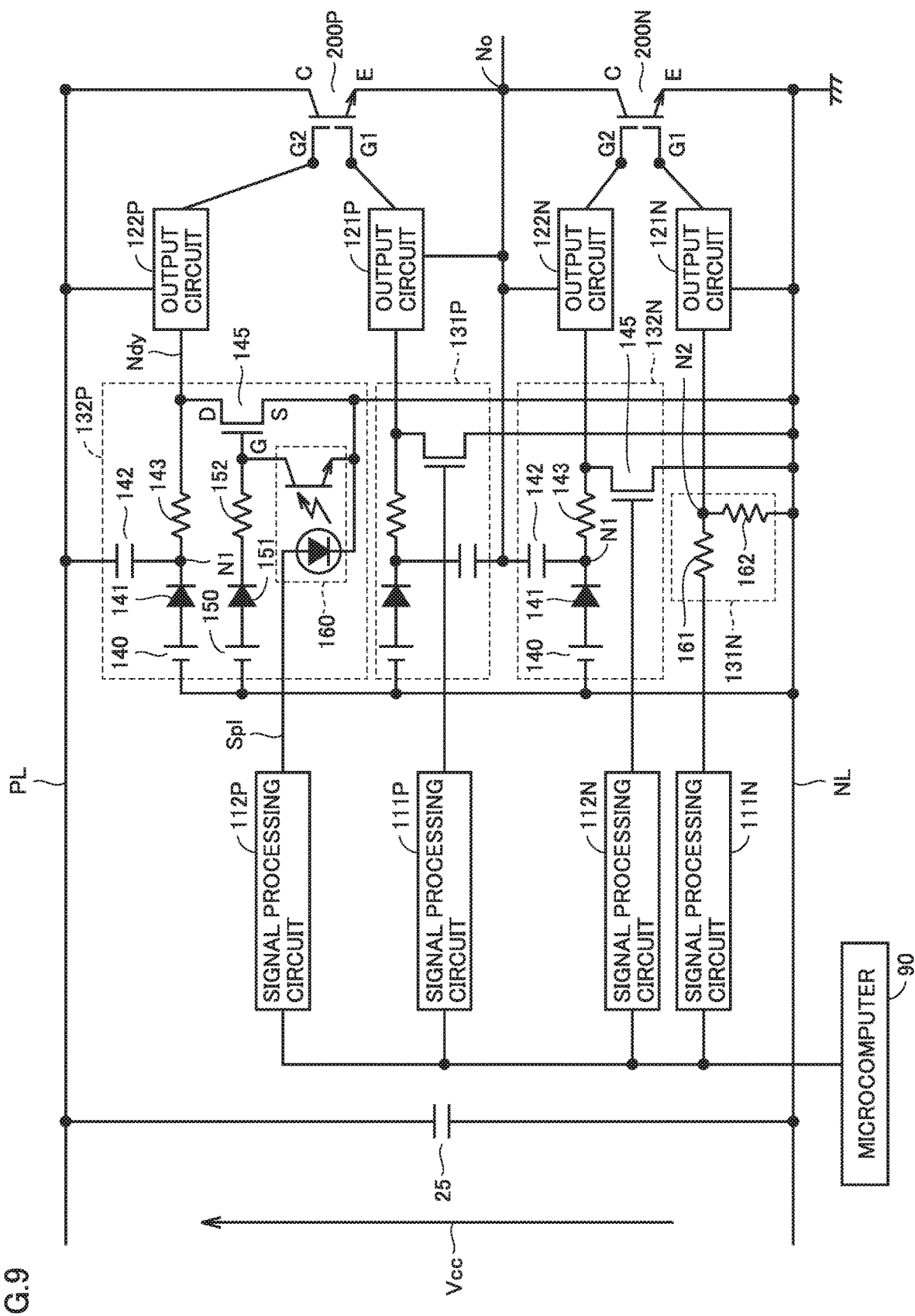
FIG. 9 is a circuit diagram illustrating a second exemplary configuration of the level shift circuit according to a modification of the first embodiment.

FIG. 9 is a circuit diagram illustrating a second exemplary configuration of the level shift circuit according to a modification of the first embodiment.

Referring to FIG. 9, in the second exemplary configuration of the level shift circuit according to the modification of the first embodiment, level shift circuit 132P corresponding to second gate G2 of P-side IGBT 200P is configured to be higher in dielectric strength voltage than other level shift circuits 131P and 132N.

For example, level shift circuit 132P further includes a DC power supply 150, a diode 151, a resistive element 152, and a photocoupler 160, in addition to DC power supply 140, diode 141, capacitor 142, resistive element 143, and NMOS transistor 145 as in level shift circuits 131P and 132N. Pulse signal Sp1 output from signal processing circuit 112 is input to photocoupler 160 representing an isolation element.

DC power supply 150, diode 151, and resistive element 152 allow supply of a bias voltage for setting NMOS transistor 145 to normally on to the gate of NMOS transistor 145. The gate of NMOS transistor 145 is further connected to power line NL (GND) on the low voltage side with photocoupler 160 being interposed.

Therefore, since the gate of NMOS transistor 145 is disconnected from power line NL during an L level period of pulse signal Sp1, ground voltage GND is input to output circuit 122P as NMOS transistor 145 is turned on. Consequently, second gate voltage Vg2 of P-side IGBT 200P is controlled to Vg2="0".

During an H level period of pulse signal Sp1, on the other hand, the gate of NMOS transistor 145 is connected to power line NL. NMOS transistor 145 is thus turned off. Since DC voltage Vdd from DC power supply 140 is thus input to output circuit 122P, second gate voltage Vg2 of P-side IGBT 200P is controlled to Vg2="+".

By thus inverting polarity (the H level/the L level) of pulse signal Sp1 from signal processing circuit 112P from the polarity in the exemplary configuration in FIG. 6, second gate voltage Vg2 of P-side IGBT 200P can be controlled as described with reference to FIG. 6. Alternatively, a similar operation can be performed also by inverting a pulse signal as in the exemplary configuration in FIG. 6 and inputting the pulse signal to photocoupler 160.

Power supply voltage Vcc of power line PL is varied by variation in output from AC/DC converter 20 (FIG. 1), superimposition of a noise voltage, and superimposition of a surge voltage caused by a switching operation of an IGBT in another arm. Variation in power supply voltage Vcc also varies a reference voltage for the second gate voltage of P-side IGBT 200P.

Variation in power supply voltage Vcc propagates as variation in voltage of output node No by turn-on of P-side IGBT 200P. Thus, the reference voltage for the first gate voltage of P-side IGBT 200P and the reference voltage for the second gate of N-side IGBT 200N are also varied. Voltage variation at output node No, however, is less than variation in power supply voltage Vcc under influence by voltage lowering in P-side IGBT 200P in the on state.

Therefore, in an actual operation of the arm implemented by IGBT 200 of the double-gate structure, a high voltage should be isolated in the drive circuit for second gate G2 of P-side IGBT 200P rather than in the drive circuit for second gate G2 of N-side IGBT 200N.

In the exemplary configuration in FIG. 8, by further arranging photocoupler 160, that is, by arranging a plurality of isolation elements in addition to the pn junction (FIG. 7) of NMOS transistor 145, level shift circuit 132P connected to second gate G2 of P-side IGBT 200P electrically isolates and separates output circuit 122P and signal processing circuit 112P from each other. Other level shift circuits 131P and 132N electrically isolate and separate output circuits 121P and 122N and signal processing circuits 111P and 112N from each other by means of the pn junction (FIG. 7) of NMOS transistor 145.

Therefore, isolation performance (that is, voltage blocking capability) of level shift circuit 132P connected to second gate G2 of P-side IGBT 200P is higher than that of another level shift circuit, in particular, level shift circuit 132N connected to second gate G2 of N-side IGBT 200N. The arm implemented by IGBT 200 of the double-gate structure can thus be operated in a stable manner in spite of variation in power supply voltage Vcc.

Isolation performance of level shift circuit 132P can be enhanced also by arranging another isolation element such as a pulse transformer instead of photocoupler 160 in the exemplary configuration in FIG. 9. The configuration for enhancing isolation performance of level shift circuit 132P is not limited as illustrated in FIG. 8.

In the configuration in FIG. 9, as in FIG. 8, level shift circuit 131N of N-side IGBT 200N can also be identical to level shift circuits 131P and 132N in circuit configuration.

Second Embodiment

In connection with a drive circuit for IGBT 200 of the double-gate structure, the number of circuits also increases in proportion to increase in number of gate electrodes, and hence there is a concern about increase in manufacturing cost. A shared configuration based on combination with the first embodiment or the modification thereof will be described in a second embodiment.

Figure 10:
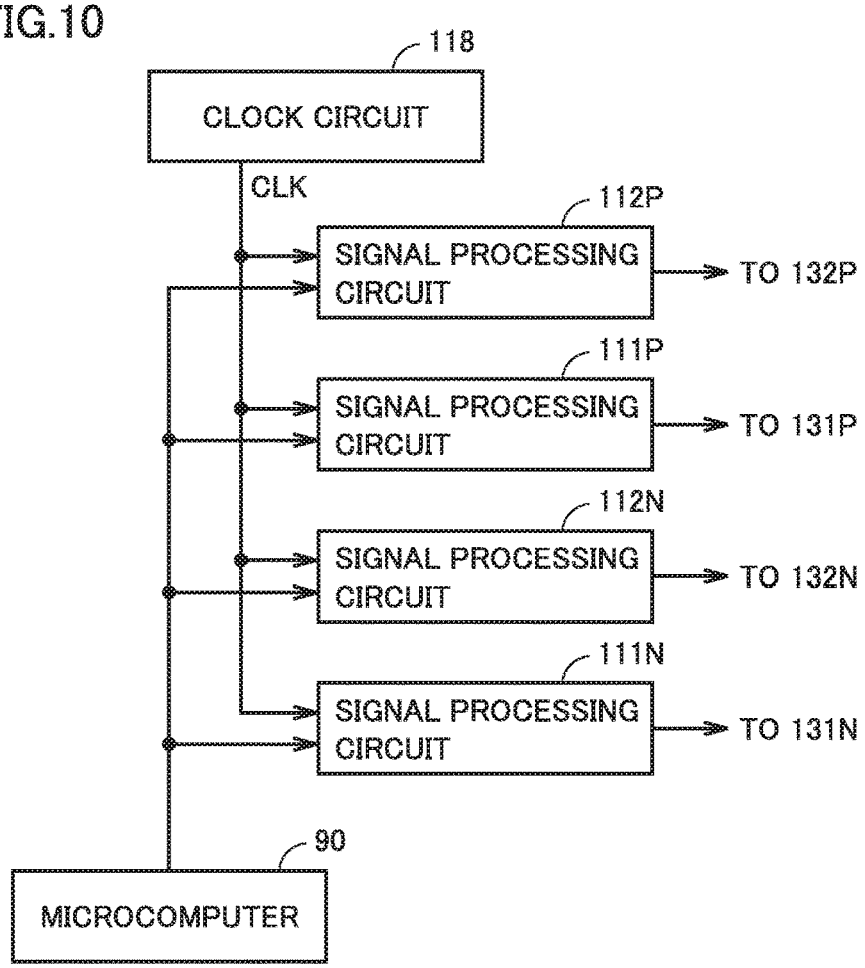
FIG. 10 is a block diagram illustrating a configuration for sharing a clock circuit according to a second embodiment.

FIG. 10 is a block diagram illustrating a configuration for sharing a clock circuit according to the second embodiment.

Referring to FIG. 10, a clock circuit 118 is shared among a plurality of signal processing circuits 111P, 112P, 111N, and 112N arranged in correspondence with first gates G1 and second gates G2 of two IGBTs 200 which implement an arm. A clock signal CLK from clock circuit 118 is input in common to signal processing circuits 111P, 112P, 111N, and 112N.

Figure 11:
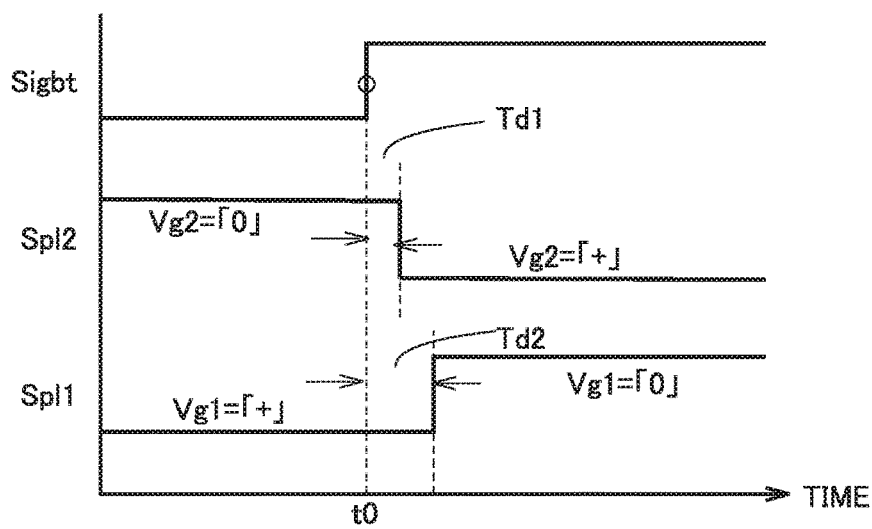
FIG. 11 is a conceptual waveform diagram for illustrating exemplary control of a gate voltage by a signal processing circuit by using a clock signal.

FIG. 11 is a conceptual waveform diagram for illustrating exemplary control of a gate voltage by a signal processing circuit by using clock signal CLK.

Referring to FIG. 11, for example, when a signal Sigbt representing an on and off command from microcomputer 90 indicates turn-on of P-side IGBT 200P, signal processing circuit 111P varies a pulse signal Sp11 from the L level to the H level for varying first gate voltage Vg1 from "+" to "0". Signal processing circuit 112P, on the other hand, varies a pulse signal Sp12 from the H level to the L level for varying second gate voltage Vg2 from "0" to "+".

In order to lower switching loss by quickly turning off IGBT 200 shown in FIG. 3 as described above, second gate voltage Vg2 is preferably varied from "+" to "0" immediately before variation in first gate voltage Vg1 from "0" to "+".

Therefore, with timing t0 of variation in signal level of Sigbt being defined as a starting point, signal processing circuit 112P varies pulse signal Sp12 from the H level to the L level after lapse of a predetermined time period Td1. Signal processing circuit 111P can perform the preferred turn-off switching operation described above by varying pulse signal Sp11 from the L level to the H level after lapse of a predetermined time period Td2 (Td2>Td1) since t0. Signal processing circuits 111P and 112P can sense lapse of time periods Td1 and Td2 by converting the elapsed time to the number of periods of common clock signal CLK from clock circuit 118. Similarly, signal processing circuits 111P, 112, 111N, and 112N can set a length of a dead time by using clock signal CLK.

Therefore, by sharing clock circuit 118 among signal processing circuits 111P, 112P, 111N, and 112N, manufacturing cost can be suppressed, and by using common clock signal CLK, accuracy in adjustment of timing in gate voltage control can be improved.

Figure 12:
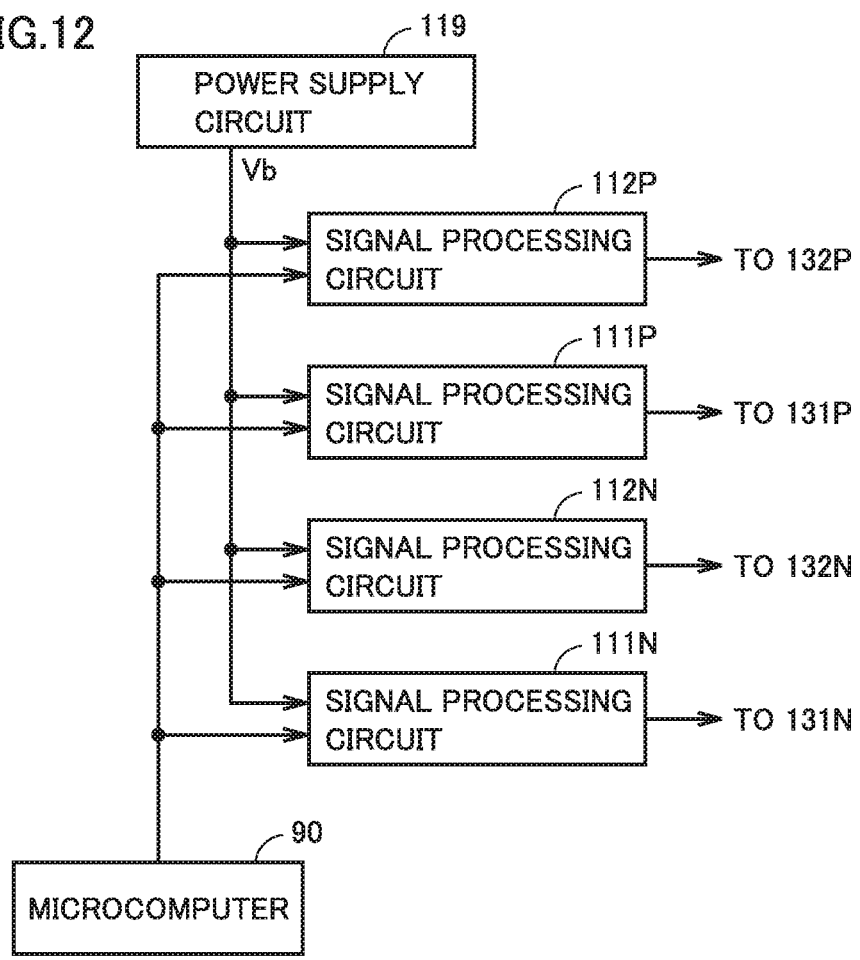
FIG. 12 is a block diagram illustrating a configuration for sharing a power supply circuit according to the second embodiment.

FIG. 12 is a block diagram illustrating a configuration for sharing a power supply circuit according to the second embodiment.

Referring to FIG. 12, a power supply circuit 119 is shared among a plurality of signal processing circuits 111P, 112P, 111N, and 112N arranged in correspondence with first gates G1 and second gates G2 of two IGBTs 200 which implement an arm. Signal processing circuits 111P, 112P, 111N, and 112N are supplied with an operating power supply voltage Vb from common power supply circuit 119.

According to such a configuration, as compared with the configuration in which each of signal processing circuits 111P, 112P, 111N, and 112N generates operating power supply voltage Vb, the number of arranged power supply circuits 119 is reduced and hence manufacturing cost can be suppressed.

The shared configuration described in the second embodiment can be combined with the first embodiment or the modification thereof.

It is noted for confirmation purpose that the configuration of the drive circuit for the IGBT of the double-gate structure described in the first embodiment and the modification thereof and the second embodiment is not limited to that for IGBT 200 of the double-sided-gate structure illustrated in FIG. 4 but is applicable in common to the IGBT of the double-gate structure as in Japanese Patent Laying-Open No. 2002-100971 and an arm configuration implemented by a gate voltage drive type semiconductor switching element represented by an IGBT including a plurality of control electrodes (gates).

Though embodiments of the present invention have been described, it should be understood that the embodiments disclosed herein are illustrative and non-restrictive in every respect. The scope of the present invention is defined by the terms of the claims and is intended to include any modifications within the scope and meaning equivalent to the terms of the claims.

What is claimed is:

1. A semiconductor device which drives first and second semiconductor switching elements connected in series, the semiconductor device comprising:
   a first drive circuit configured to control on and off of the first semiconductor switching element; and
   a second drive circuit configured to control on and off of the second semiconductor switching element,
   the first semiconductor switching element including a first positive electrode and a first negative electrode as main electrodes and first and second control electrodes,
   the second semiconductor switching element including a second positive electrode and a second negative electrode as main electrodes and third and fourth control electrodes, the second positive electrode being electrically connected to the first negative electrode,
   the first drive circuit including
      a first drive circuit unit configured to control a voltage of the first control electrode with respect to the first negative electrode, and
      a second drive circuit unit configured to control a voltage of the second control electrode with respect to the first positive electrode,
   the second drive circuit including
      a third drive circuit unit configured to control a voltage of the third control electrode with respect to the second negative electrode, and
      a fourth drive circuit unit configured to control a voltage of the fourth control electrode with respect to the second positive electrode,
   each of the first to fourth drive circuit units including
      a signal processing circuit configured to output a pulse signal serving as a voltage command for a corresponding control electrode of the first to fourth control electrodes in response to an on and off command to turn on and off the first and second semiconductor switching elements, and
      an output circuit configured to drive a voltage of the corresponding control electrode with respect to a corresponding main electrode of the first and second positive electrodes and the first and second negative electrodes in response to the pulse signal from the signal processing circuit,
   each of the first, second and fourth drive circuit units being configured to transmit the pulse signal from the signal processing circuit to the output circuit through an isolation structure.

2. The semiconductor device according to claim 1, wherein
   the isolation structure is implemented by a pn junction of a semiconductor element including an n-type region electrically connected to the output circuit.

3. The semiconductor device according to claim 2, wherein
   each of the first, second and fourth drive circuit units includes a level shift circuit connected between the signal processing circuit and the output circuit, the level shift circuit includes a field effect transistor connected to switch a voltage to be input to the output circuit in accordance with on and off, and the field effect transistor includes
a gate to which the pulse signal is input, and
a p-type region including a region formed directly under the gate, the p-type region forms the pn junction together with the n-type region connected to the output circuit.

4. The semiconductor device according to claim 3, wherein
in the third drive circuit unit, the signal processing circuit and the output circuit are electrically connected to each other without the isolation structure being interposed.

5. The semiconductor device according to claim 3, wherein
in the third drive circuit unit, the signal processing circuit and the output circuit are connected to each other with the isolation structure similar to the isolation structure in the fourth drive circuit unit being interposed.

6. The semiconductor device according to claim 3, wherein
in the third drive circuit unit, the signal processing circuit and the output circuit are connected to each other with the isolation structure similar to the isolation structure in each of the first, second and fourth drive circuit units being interposed.

7. The semiconductor device according to claim 6, wherein
the isolation structure in the second drive circuit unit is higher in withstand voltage than the isolation structure in the fourth drive circuit unit.

8. The semiconductor device according to claim 7, wherein
the signal processing circuit of each of the first to fourth drive circuit units is configured to generate the pulse signal based on the on and off command and a clock signal supplied by a common clock circuit.

9. The semiconductor device according to claim 8, wherein
the signal processing circuit of each of the first to fourth drive circuit units is supplied with an operating power supply voltage from a common power supply circuit.

10. The semiconductor device according to claim 9, wherein
the first and second drive circuits and the first and second semiconductor switching elements are contained in a single module as an integrated structure.

11. The semiconductor device according to claim 1, wherein
in the third drive circuit unit, the signal processing circuit and the output circuit are electrically connected to each other without the isolation structure being interposed.

12. The semiconductor device according to claim 1, wherein
in the third drive circuit unit, the signal processing circuit and the output circuit are connected to each other with the isolation structure similar to the isolation structure in the fourth drive circuit unit being interposed.

13. The semiconductor device according to claim 1, wherein
in the third drive circuit unit, the signal processing circuit and the output circuit are connected to each other with the isolation structure similar to the isolation structure in each of the first, second and fourth drive circuit units being interposed.

14. The semiconductor device according to claim 1, wherein
the isolation structure in the second drive circuit unit is higher in withstand voltage than the isolation structure in the fourth drive circuit unit.

15. The semiconductor device according to claim 1, wherein
the signal processing circuit of each of the first to fourth drive circuit units is configured to generate the pulse signal based on the on and off command and a clock signal supplied by a common clock circuit.

16. The semiconductor device according to claim 1, wherein
the signal processing circuit of each of the first to fourth drive circuit units is supplied with an operating power supply voltage from a common power supply circuit.

17. The semiconductor device according to claim 1, wherein
the first and second drive circuits and the first and second semiconductor switching elements are contained in a single module as an integrated structure.

* * * * *